(12) United States Patent
Arigliano (10) Patent No.: US 7,038,550 B2
(45) Date of Patent: May 2, 2006

(54) SMART CURRENT CONTROLLED (SCC) RESONATOR DRIVER

(75) Inventor: Antonello Arigliano, Germering (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 28 days.

(21) Appl. No.: 10/957,130

(22) Filed: Oct. 1, 2004

(65) Prior Publication Data

US 2006/0061424 A1    Mar. 23, 2006

(30) Foreign Application Priority Data

Sep. 21, 2004    (EP) .................................. 04392035

(51) Int. Cl.
*H03L 5/00* (2006.01)
*H03B 5/30* (2006.01)
*H03B 5/36* (2006.01)

(52) U.S. Cl. ............................... 331/109; 331/116 FE; 331/154; 331/158; 331/183

(58) Field of Classification Search ............ 331/108 R, 331/109, 116 R, 116 FE, 117 R, 117 FE, 331/117 D, 154, 158, 182, 183
See application file for complete search history.

(56) References Cited

U.S. PATENT DOCUMENTS

| | | | |
|---|---|---|---|
| 4,835,492 A * | 5/1989 | Ikuhara et al. ........... | 331/117 D |
| 5,469,116 A | 11/1995 | Slemmer ...................... | 331/74 |
| 6,037,843 A | 3/2000 | Hunt ....................... | 331/177 V |
| 6,577,204 B1 | 6/2003 | Midtgaard ................... | 331/158 |
| 6,727,769 B1 | 4/2004 | Aihara et al. ............... | 331/158 |

FOREIGN PATENT DOCUMENTS

| | | |
|---|---|---|
| JP | 2037809 | 2/1990 |
| JP | 7007325 | 1/1995 |
| JP | 7015239 | 1/1995 |
| JP | 8018340 | 1/1996 |

OTHER PUBLICATIONS

"High-Performance Crystal Oscillator Circuits: Theory and Application," by Vittoz et al., IEEE Jrnl. of Solid-State Cir. vol. 23, No. 3, Jun. 1988, pp. 774-783.
"MOS Crystal Oscillator Design," by Meyer et al., IEEE Jrnl. of Solid-State Circuit, vol. sc-15, No. 2, Apr. 1980, pp. 222-228.

* cited by examiner

*Primary Examiner*—David Mis
(74) *Attorney, Agent, or Firm*—George O. Saile; Stephen B. Ackerman (57) ABSTRACT

A circuit and a method are given, to realize and implement an oscillator circuit with a Smart Current Controlled (SCC) Resonator Driver. A newly introduced controlled current source for a crystal oscillator's amplifier element produces a controlled driving current for the resonator element during operation in both phases of the oscillation cycle to reach for low phase noise and reduced power consumption of the circuit. Said circuit and method are designed in order to be implemented with a very economic number of components, capable to be realized with modern integrated circuit technologies.

32 Claims, 9 Drawing Sheets

Start generating continuous oscillations, consisting of alternating half-waves of oscillation cycles by alternatively operating said SCC Resonator Driver oscillator circuit in said two operation phases (phase 1 and phase 2) with said resonator-current flowing in both directions through said resonator element fed in by said first current source and said second controlled current source in connection with said oscillation inducing and sustaining FET, thus stabilizing said oscillation generation effectively especially with regard to frequency and amplitude stability — 740

SMART CURRENT CONTROLLED (SCC) RESONATOR DRIVER

BACKGROUND OF THE INVENTION (1) Field of the Invention

The present invention relates generally to electronic oscillators and in particular to improved crystal resonator oscillators, thin-film resonator or micro electromechanical resonator oscillators, realized with monolithic integrated-circuit technologies, where one chip solutions include automatic current control and biasing to accommodate a highly accurate frequency-generation exhibiting low phase noise and stable amplitudes up to higher frequencies.

(2) Description of the Prior Art

Crystal oscillators in monolithic integrated circuit technology are developed using Pierce oscillator or three-point oscillator circuit schemes, where the frequency determining resonator is working in a resonance mode, where the equivalent reactance is inductive. Realized with quartz crystals as resonators normally phase noise is considered sufficiently good at frequency offsets not too far away from the oscillator carrier signal. It would be advantageous to extend the operating range whilst maintaining a good phase noise behavior at farther away offsets.

Crystal-controlled oscillators have been in use for decades in electronic systems as frequency references; but such oscillators have mostly been implemented using bi-polar transistors as active elements. However, the dominant technology for the fabrication of most integrated circuits today is CMOS and design techniques for highly stable crystal oscillators in this technology are less well known, especially when it comes to frequencies of about 100 MHz, as necessary for modern communication applications.

In the prior art, there are different technical approaches for achieving the goals of good—over wider ranges—tunable circuits and low phase noise. These crystal oscillator arrangements always include a piezo-electric, e.g. quartz, crystal and drive current means therefore. Unfortunately, these approaches are somewhat expensive, both in terms of technical complexity (e.g. differential push-pull or balanced bridge structures, extra filter or tank circuits, sophisticated temperature compensation or gain control circuits, amplitude peak detectors etc.) and—hence—commercial costs. It would be advantageous to reduce both expenses. This is achieved by using an oscillator circuit working with a crystal in inductive resonance mode, as three-point oscillator derived from the Pierce oscillator. Using the intrinsic advantages of that solution—as described later on in every detail—the circuit of the invention is realized with standard CMOS technology at low cost.

Preferred prior art realizations are implementing such related crystal oscillator circuits in single chip or multiple chip solutions as integrated circuits. The large chip areas needed and consequently the high costs are the main disadvantages of these prior art solutions. It is therefore a challenge for the designer of such devices and circuits to achieve a high-quality but also low-cost solution.

Several prior art inventions referring to such solutions describe related methods, devices and circuits, and there are also several such solutions available with various patents referring to comparable approaches, out of which some are listed in the following:

U.S. Pat. No. 6,037,843 (to Hunt) describes a controllable reactance circuit for an integrated circuit, which includes a controllable reactance implemented within an integrated circuit includes a first sub-circuit comprising a reactive element, for example a capacitor, coupled in series with a transistor. A controllable current source injects a controllable bias current through the transistor to vary the effective resistance of the transistor and hence the effective complex impedance of the capacitor combination. A second transistor amplifies the current to increase the effective capacitance. Preferably, a second sub-circuit includes corresponding components to mirror the real component of the current flowing in the first sub-circuit, and transistors to reflect an inverse current to the coupling node line to cancel the real component of the current at the node, to thus simulate a purely capacitive circuit. An oscillator embodying this circuit is also disclosed. The invention can provide a controllable capacitance without the need for a conventional varactor diode.

U.S. Pat. No. 6,577,204 (to Midtgaard) discloses an electronic circuit supplied with power via current generator means, whereby in an electronic circuit supplied from supply terminals, a terminal in the circuit being biased to a voltage between the supply terminal voltages, connections from power supply terminals are made via current generator means. The circuit is preferably an RF, balanced and/or oscillator circuit. The current generator means are preferably controllable current generators, preferably controlled by an AGC, or a common mode or differential voltage control circuit. Preferably, the controllable current generators comprise a FET or are substantially constituted by each one MOS-FET. A balanced, common-base, low-voltage Pierce crystal oscillator with two transistors and four to six current generator means is disclosed.

U.S. Pat. No. 6,727,769 (to Aihara et al.) shows a crystal oscillator circuit using CMOSFETs including an oscillator circuit that is constructed of a resonating section and an amplifying section having a CMOSFET, a reference current source circuit for generating a reference current which determines a bias current of the amplifying section, and a control signal generator circuit for controlling the reference current source circuit to make a bias current larger than that in the oscillation status when the oscillator circuit is in the non-oscillation status. As a result, the reference current source circuit constant-current biases the DC bias of the amplifying section without depending on the source voltage. Therefore, it can lower the driving source voltage of the oscillator circuit. Further, only the bias current of the amplifying section is increased during the oscillation starting period of the oscillator circuit, so that the oscillator circuit can provide a stable oscillation with low power, without variations in the source voltage.

The related literature sees two relevant papers. In the paper from Robert G. Meyer et al.—cited here as [Meyer, R. G. Soo, D. C.-F. "MOS Crystal Oscillator Design," IEEE Journal of Solid-State Circuits, Vol. SC-15, No. 2, April 1980, pp. 222–228] first, describing the operation of MOS crystal oscillators as investigated assuming near-sinusoidal AC voltages at gate and drain, wherein is shown that the circuit operation depends basically on only two normalized parameters. Computer solutions are used to produce a series of normalized curves allowing oscillator design for prescribed start-up conditions, steady-state amplitude, and operating current. The theoretical predictions therein agree closely with measurements on sample circuits. The second paper from Eric A. Vittoz et al. cited here as [Vittoz, E. A. Degrauwe, M. G. R. & Bitz, S. "High-Performance Crystal Oscillator Circuits: Theory and Application," IEEE Journal of Solid State Circuits, Vol. SC-23, No. 3, June 1988, pp. 774–783] presents a general theory that allows the accurate linear and nonlinear analysis of any crystal oscillator circuit.

It is based on the high Q of the resonator and on a very few non-limiting assumptions. The special case of the three-point oscillator, that includes Pierce and one-pin circuits, is analyzed in more detail. A clear insight into the linear behavior, including the effect of losses, is obtained by means of the circular locus of the circuit impedance. A basic condition for oscillation and simple analytic expressions are derived in the loss-less case for frequency pulling, critical transconductance, and start-up time constant. The effects of nonlinearities on amplitude and on frequency stability are analyzed. As an application, a 2-MHz CMOS oscillator which uses amplitude stabilization to minimize power consumption and to eliminate the effects of nonlinearities on frequency is described. The chip, implemented in a 3-µm p-well low-voltage process, includes a three-stage frequency divider and consumes 0.9 µA at 1.5 V. The measured frequency stability is 0.05 p.p.m./V in the range 1.1–5 V of supply voltage. Temperature effect on the circuit itself is less than 0.1 p.p.m. from −10 to +60° C.

Figure 1A:
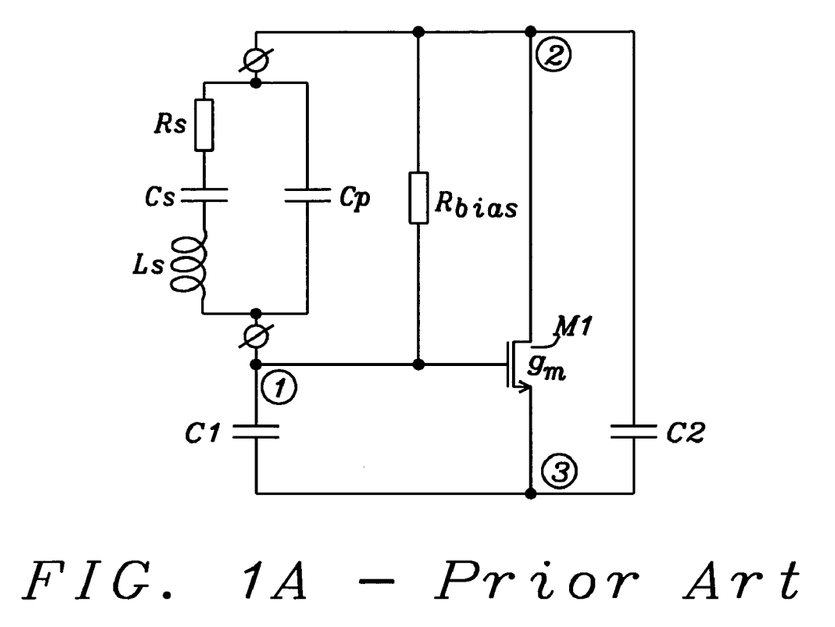
FIG. 1A prior art shows the basic three-point oscillator circuit in form of a simplified circuit diagram.
Figure 1B:
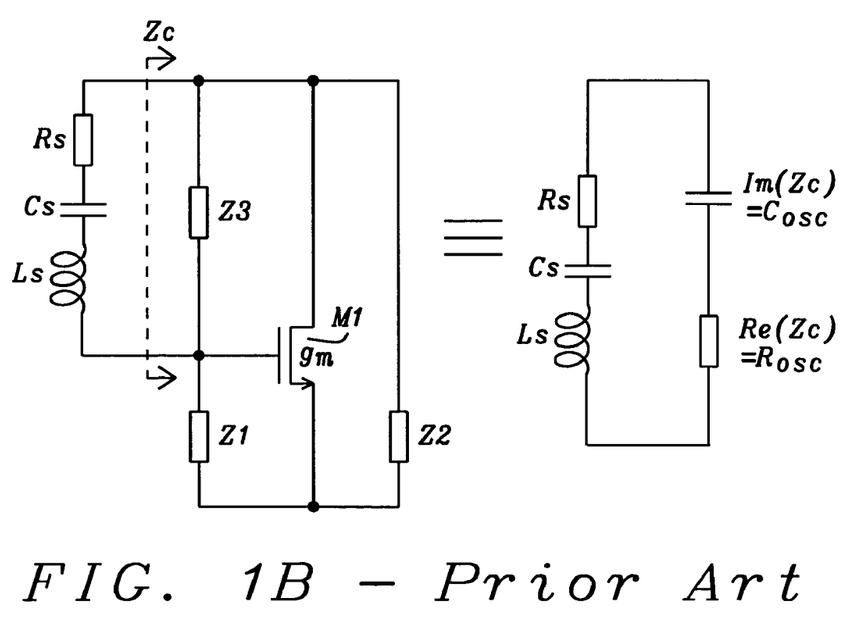
FIG. 1B prior art redraws this configuration somewhat more generally on the left side, and show its electrically equivalent circuit diagram on the right side.

The basic three-point oscillator circuit is shown in FIG. 1A prior art in form of a simplified circuit diagram (i.e. without power supply and ground connections) with one Field Effect Transistor (FET) M1 with conductance $g_m$ as the active i.e. amplifying component and named as such also as basic active component, connected at said three nodes (1, 2 & 3 shown encircled) to a resonator element (with its equivalence elements: resistance Rs, capacitance Cs and inductance Ls and a parasitic capacitance Cp); the FET being current-voltage biased by a resistive component $R_{bias}$ and all embedded within a capacitance PI-configuration, consisting of two capacitors C1 and C2. FIG. 1B prior art on the left side redraws this configuration somewhat more generally, now introducing three impedances Z1, Z2 and Z3 as substitution for Cp, $R_{bias}$ as well as C1 and C2 from FIG. 1A prior art, it shall be pointed out, that the resonator can now be understood as virtually terminated by a complex impedance Zc. On the right side an electrically equivalent circuit is given, with Rs, Cs and Ls from the resonator equivalence diagram and these virtual complex impedance Zc, represented by its real and imaginary parts Re(Zc)=$C_{OSC}$ and Im(Zc)=$R_{OSC}$. This virtual impedance Zc replaces the whole active driving part of the oscillator and by virtue of power matching, ruling that the impedance Zc has to be conjugated complex i.e. the resonator being essentially inductive we need an essentially capacitive impedance Zc, such as it is depicted in FIG. 1B prior art to the utmost right with a serial circuit of $R_{OSC}$ and $C_{OSC}$, therefore obligatory incorporating the effects of the load capacitors C1 and C2. Some further aspects for design and development of oscillator Integrated Circuits (IC) shall be noted here. Today's ICs are complete electronic systems often requiring a crystal oscillator to generate an accurate clock signal. Recent advances in technology allow for ever increasing clock frequencies. The standard configuration for clock generators is a Pierce oscillator that has the crystal and its load capacitors connected between two pins of the IC. With the trend to minimize the number of external components the load capacitors are sometimes integrated. In order to be able to trim the resonance frequency these load capacitors can then be implemented as capacitor banks switched by digital circuitry. In a Pierce oscillator both capacitors are referring to ground facilitating the use of MOS gate capacitances and thereby greatly reducing the chip area. Still due to the limited number of pins on an IC-package it is desirable to have the same function with a single pin and the crystal referring to ground. Several one pin oscillators have been reported, but they all need at least one floating capacitor. This leads to large chip area or expensive process options and difficulties with respect to tuning by means of switched capacitor banks. Most one pin oscillators are a variant of the three point oscillator of which the basic oscillator block is depicted in FIG. 1A prior art, wherein the crystal is represented as a series resonant branch Rs, Cs and Ls and said parasitic lead capacitor Cp. If node 1 (encircled) or 2 (encircled) is set to ground and the other nodes are properly biased the crystal can be externally grounded. This results in a one pin oscillator. Setting node 3 (encircled) to ground instead gives a Pierce oscillator. C1 and C2 are the load capacitors of which the series value should equal the crystals specific load capacitance to obtain the nominal crystal frequency. The importance of these oscillator circuits for modern IC-design is therefore clearly explained; for oscillators of the three-point, Pierce and one-pin type likewise.

Figure 2A:
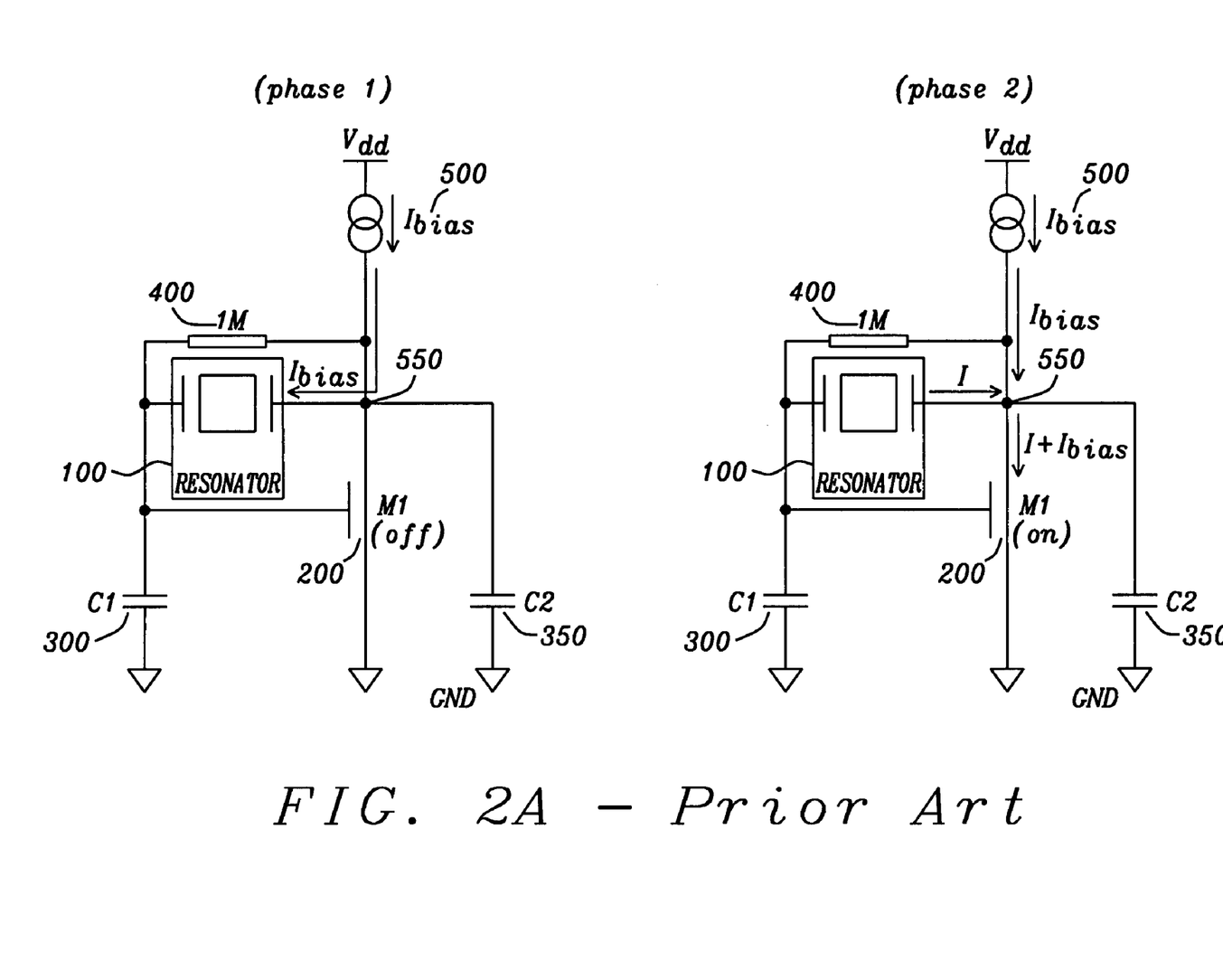
FIG. 2A prior art depicts the actual prior art configuration as enhanced and ameliorated by this invention in form of two circuit schematics.

Turning our attention now to FIG. 2A prior art the actual prior art configuration as enhanced and ameliorated by this invention is shown in form of two circuit schematics, designated as (phase 1) and (phase 2) diagrams. Whereby this phase distinction refers to the operating in opposite half-waves of an oscillation, i.e. the resonator currents I and $I_{bias}$ respectively flowing through the resonator in opposite directions. In a classic three-point oscillator, as described above, the source of the FET M1 as basic active component is directly connected to ground. During (phase 2), the resonator current I, flowing from the resonator to ground is determined only by the impedance of the transistor M1 and the resonator parameters. This current can have peaks of several mA. These current peaks generate considerable noise to ground and big voltage undershoots on the FET M1 gate voltage, with an unwanted duty cycle degradation of the clock signal as inevitable consequence. It is therefore a challenge for the designer of such devices and circuits to achieve a high-quality and also low-cost solution, avoiding these drawbacks.

Although these patents and papers describe circuits and/or methods close to the field of the invention they differ in essential features from the method, the system and especially the circuit introduced here.

SUMMARY OF THE INVENTION

A principal object of the present invention is to realize a circuit for generating resonator operation stabilized oscillations in form of very manufacturable integrated circuits at low cost.

Another principal object of the present invention is to provide an effective and very manufacturable method and circuit for generating resonator stabilized oscillation signals. The results are especially applicable and very efficient for use with resonators at least made up of Quartz or Piezo crystals, or of Thin-Film Resonators (TFR) or Micro Electro Mechanical System (MEMS) resonators but not restricted to only those types of resonators.

Another further object of the present invention is to attain low amplitude distortion of the oscillator signal.

Another still further object of the present invention is to reach a low phase noise behavior of the circuit, i.e. to attain a high frequency stability.

Another object of this invention is minimizing the distortion and the phase noise of the generated oscillation signal in steady state operation.

A still further object of the present invention is to reduce the power consumption of the oscillator circuit by putting into effect design features, resulting from a newly introduced current control.

Another further object of the present invention is to reduce the cost of manufacturing by implementing the circuit as a monolithic integrated circuit in low cost CMOS technology.

Also an object of the present invention is to lessen the dependence from resonator parameters and active components characteristics and at the same time to thereby reach a low-cost realization with modern integrated circuit technologies.

Another still further object of the present invention is to reduce cost by minimizing the chip area by means of effectively minimizing component values.

Further another object of the present invention is to give a new method, whereby the current peaks through a resonator element are limited to a prescribed biasing current value and by this means achieve a substantial noise to ground reduction and equally a distortion reduction.

Another principal object of the present invention is to provide a method for an effective reduction of undershoots of the input sinus signal i.e. the voltage at the gate of the regulating feedback FET, thus resulting in less noise and a better duty cycle, where undershoots are voltages below ground potential depending on resonator impedance and drive current and thereby producing noise distributed in the device.

Also another further object of the present invention is to enhance the operation over corners of performance with regard to temperature and process variations and easily and additionally implementable with the new circuit.

In accordance with the objects of this invention, a new circuit is described, capable of realizing a new oscillator circuit with a Smart Current Controlled (SCC) Resonator Driver and accounting for differences in operation at positive and negative half-waves of oscillation cycles, comprising an oscillation generating circuit in form of a basic three-point oscillator configuration, having three nodes (1, 2 and 3) and containing a resonator two-pole located between said first node 1 and said second node 2; a terminal pin for supply voltage connection; a terminal pin for ground connection, which is tied to said third node 3; two capacitors and one resistor as passive components, whereby said passive components are embedding said resonator two-pole between said two capacitors, all components arranged in PI-configuration, bridging said resonator with said resistor and arranged in such a way, that capacitor one is tied with its first pole to said first node 1 and capacitor two, also with its first pole, is tied to said second node 2; a Field Effect Transistor (FET) for inducing and sustaining resonator two-pole controlled oscillations as basic active component; a first current source as active supply component connected to said supply voltage and arranged in such a way, that said active supply component supplying a bias-current is located between said voltage supply terminal and said second node 2; and a second current source as active ground component connected to ground, whereby said FET as basic active component, supplied by said first current source as active supply component is controlled by said second current source as active ground component and whereby said three active components are arranged in such a way, that the gate of the FET is tied to said first node 1, one side of the FET channel tied to said second node 2 and the other side of the FET channel is tied to said second current source thus allowing for a resonator-current stabilization during said different operations at positive and negative half-waves of oscillation cycles, and thus effectively stabilizing said oscillation generation especially with regard to frequency and amplitude stability.

Further in accordance with the objects of this invention, a new circuit is described, capable of realizing a new oscillator circuit with a Smart Current Controlled (SCC) Resonator Driver and accounting for differences in operation at positive and negative half-waves of oscillation cycles, comprising oscillation generating means containing a resonator two-pole element as oscillation defining element; amplifying means for inducing and sustaining said resonator two-pole controlled oscillations; power supplying means with supply voltage connection; means for a ground connection; and current controlling means for said amplifying means implemented as controlled current sources arranged in such a way, that said amplifying means is fed with appropriately controlled currents depending on its operation at positive and negative half-waves of an oscillation cycle always securing a resonator-current flowing through said resonator two-pole necessary for optimized driving of said resonator element and thus allowing for a resonator-current stabilization during said different operations at positive and negative half-waves of oscillation cycles, therefore effectively stabilizing said oscillation generation especially with regard to frequency and amplitude stability.

Also in accordance with the objects of this invention, a new method for an oscillation generating circuit is described, implementing a Smart Current Controlled (SCC) Resonator Driver oscillator circuit and accounting for differences in operation at positive and negative half-waves of oscillation cycles, comprising providing oscillation generating means containing a resonator two-pole element as oscillation defining element; providing amplifying means for inducing and sustaining said resonator two-pole controlled oscillations; providing current controlling means for said amplifying means implemented as controlled current sources; providing power supplying means with supply voltage connection; providing means for a ground connection; operating said SCC Resonator Driver oscillator circuit in two distinct phases correlated respectively to the two different polarities of the generated half-waves of the oscillation cycles and characterized by the current flow passing through said resonator two-pole elements in opposite directions, a first and a second one related to positive or negative polarities; defining said operation in a first half-wave as first phase operation (phase 1) with a resonator-current flowing from said power supplying means into said resonator two-pole element; defining said operation in a second half-wave as second phase operation (phase 2) with a resonator-current flowing out from said resonator two-pole element into said amplifying means; controlling said first phase operation (phase 1) in such a way, that said oscillation inducing and sustaining amplifying means in conjunction with said current controlling means controls said resonator two-pole element within said oscillation generating means in order to stabilize the current flow passing through said resonator two-pole element in the first direction to a certain maximal amount; controlling said second phase operation (phase 2) in such a way, that said oscillation inducing and sustaining amplifying means in conjunction with said current controlling means controls said resonator two-pole element within said oscillation generating means in order to stabilize the current flow passing through said resonator two-pole element in the second direction to the same maximum amount; and starting the generation of continuous oscillations, consisting of alternating half-waves of oscillation cycles by alternatively operating said SCC Resonator Driver oscillator circuit in said two operation phases (phase 1 and phase 2) with said resonator-current flowing in both directions through said resonator element fed in by said oscillation inducing and sustaining amplifying means in conjunction with said current controlling means, thus stabilizing said oscillation generation effectively especially with regard to frequency and amplitude stability.

Also further in accordance with the objects of this invention, a new method is described, capable of realizing an oscillation generating circuit implemented as a Smart Current Controlled (SCC) Resonator Driver oscillator circuit and accounting for differences in operation at positive and negative half-waves of oscillation cycles, comprising providing an oscillation generating circuit in form of a basic three-point oscillator configuration, having three nodes (1, 2 and 3) and containing a resonator two-pole located between said first node 1 and said second node 2 as well as further passive and active components; providing a terminal for supply voltage connection; providing a terminal for ground connection, which is tied to said third node 3; providing said passive components for said basic three-point oscillator circuit in form of two capacitors and one resistor embedding said resonator two-pole between said two capacitors, all arranged in PI-configuration, bridging said resonator with said resistor and in such a way, that capacitor one is tied with its first pole to said first node 1 and capacitor two, also with its first pole, tied to said second node 2; providing as active components for said basic three-point oscillator circuit a FET for inducing and sustaining resonator two-pole controlled oscillations, supplied by a first current source and controlled by a second current source arranged in such a way, that the gate of the FET is tied to said first node 1, one side of the FET channel tied to said second node 2 and the other side of the FET channel is tied to said second current source; connecting said two capacitors with their second poles and said second current source with its second pole to ground, which is identical to said third node 3; arranging said first current source with its supplied bias-current between said voltage supply terminal and said second node 2; operating said SCC Resonator Driver oscillator circuit in two distinct phases correlated respectively to the two different polarities—positive or negative—of the generated half-waves of the oscillation cycles and characterized by the current flow passing through said resonator two-pole element in opposite directions, a first and a second one; defining said operation in a first half-wave as first phase operation (phase 1) with a resonator-current flowing in said first direction, from said second node 2 into said resonator element; defining said operation in a second half-wave as second phase operation (phase 2) with a resonator-current flowing in said second direction, out from said resonator element into said second node 2; controlling said first phase operation (phase 1) with a resonator-current flowing in said first direction in such a way, that said oscillation inducing and sustaining FET is switched OFF and said second current source therefore conducts no current; controlling said second phase operation (phase 2) with a resonator-current flowing in said second direction in such a way, that said oscillation inducing and sustaining FET is switched ON and said second current source therefore is conducting current, up to a controlled current peak with a maximum of two times of said bias-current delivered from said first current source and from said resonator element, summing up together at said second node 2; and starting the generation of continuous oscillations, consisting of alternating half-waves of oscillation cycles by alternatively operating said SCC Resonator Driver oscillator circuit in said two operation phases (phase 1 and phase 2) with said resonator-current flowing in both directions through said resonator element fed in by said first current source and said second controlled current source in connection with said oscillation inducing and sustaining FET, thus stabilizing said oscillation generation effectively especially in regard to frequency and amplitude stability.

BRIEF DESCRIPTION OF THE DRAWINGS

In the accompanying drawings forming a material part of this description, the details of the invention are shown.

DESCRIPTION OF THE PREFERRED EMBODIMENTS

The preferred embodiment discloses a novel oscillator circuit with a Smart Current Controlled (SCC) Resonator Driver.

Figure 2B:
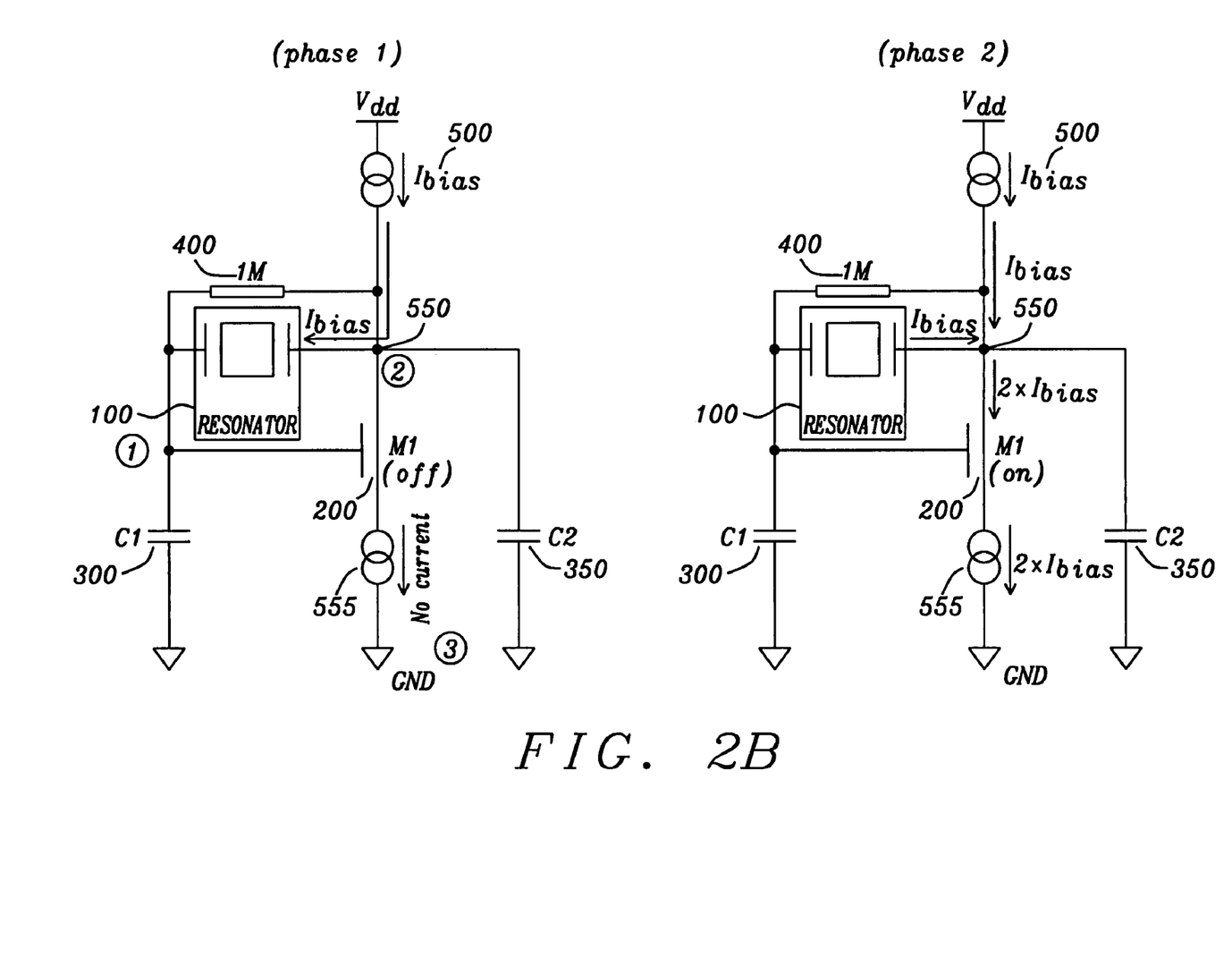
FIG. 2B shows the electrical circuit diagram for the new oscillator circuit with a Smart Current Controlled (SCC) Resonator Driver, enhanced by an additional, controlled current source as a preferred embodiment of the present invention implementable with a variety of modern monolithic integrated circuit technologies.

Contemplating now FIG. 2B, a circuit diagram of the new oscillator circuit with a Smart Current Controlled (SCC) Resonator Driver is given in form of two circuit schematics, designated as (phase 1) and (phase 2) diagrams. Whereby this phase distinction refers to the operating in opposite half-waves of an oscillation cycle, i.e. the resonator-currents $I_{bias}$ flowing respectively through the resonator in opposite directions. The essential components from the basic three-point oscillator circuit as shown in FIG. 1A prior art can be relocated: between the supply voltage $V_{dd}$ and ground (GND) a first current source 500, named also as active supply component, delivering the bias-current $I_{bias}$ leads to a central connection point 550 (comparable to node 2 (encircled) in FIG. 1A prior art), from there to ground said FET M1 (item 200) is connected in series with said newly introduced controlled current source 555, named also as active ground component and enhancing the prior art circuit to said SCC Resonator Driver oscillator circuit. The resonator element 100, shown here as a quartz crystal resonator is embedded between said two load capacitors C1 and C2 (items 300 and 350 respectively) and connected in such a way, that one pin of the two-pole resonator, node 1 (comparable to node 1 (encircled) in FIG. 1A prior art) is tied to capacitor C1 (item 300) and the other pin, node 2 (comparable to node 2 (encircled) in FIG. 1A prior art) to said central connection point 550, together with capacitor C2 (item 350) and said FET M1 (item 200) on its part serially connected with a second current source, said additionally introduced enhancing controlled current source 555 as well. Said controlled second current source 555 then leads on to ground node 3 (comparable to node 3 (encircled) in FIG. 1A prior art) with voltage GND. A last component of the circuit is a resistor 400 of approximately 1 MOhm e.g., which is bridging said resonator two-pole element in order to supply the drive current to the gate of said FET M1 (item 200), which is tied to the connection point node 1 (comparable to node 1 (encircled) in FIG. 1A prior art) of one resonator pin with capacitor C1 (item 300). The influence of this resistor on the bias-current behavior shall be neglected in the following. Determined by comparing to FIG. 2A prior art, it can be seen, that the only difference is the newly introduced enhancing controlled current source 555. Considering now the operation of said SCC Resonator Driver oscillator circuit in (phase 1), whereby the bias-current $I_{bias}$ from said first current source 500 is flowing into the resonator 100 and through it via capacitor C1 (item 300) to ground, said FET M1 (item 200) is switched OFF, thus no current is flowing through said second controlled current source 555 and the resonator 100 is operating in a first half-wave of an oscillation cycle. FET M1 (item 200) is switched OFF because the voltage at node 1 is lower than the voltage at node 2 (item 550). The operation of said SCC Resonator Driver oscillator circuit in (phase 2) is analogical, whereby now the bias-current $I_{bias}$ from said first current source 500 is continuing to flow with value $I_{bias}$ into the circuit, however now the resonator 100 is delivering a current of value $I_{bias}$ delivered on its part back from capacitor C1, while operating in a second half-wave of an oscillation cycle with opposite polarity, and thus adding up the currents at node 2 to two-times the bias-current $I_{bias}$, flowing through FET M1 (item 200) via said second current source 555 to ground, said FET M1 (item 200) being now switched ON, thus said current of value $2*I_{bias}$ is flowing through said second controlled current source 555, forcing the resonator-current to not exceed a value of $I_{bias}$. FET M1 (item 200) is switched ON because the voltage at node 1 is higher than the voltage at node 2 (item 550).

During (phase 2) without said second controlled current source 555, a resonator-current "I" delivered from capacitor C1 (item 300) via said resonator 100 and via FET M1 (item 200) to ground would be determined only by the impedance of FET M1 (item 200) and the resonator parameters. This current can therefore become very large, having peaks of several mA. These current peaks would generate a "noise-to-ground" voltage and big voltage undershoots on the FET's M1 (item 200) gate voltage. In the SSC oscillator, as described above, the resonator is fed always with the same current $I_{bias}$, with positive or negative sign, depending on its working phase. This means, that in the SSC oscillator the current peaks are controlled and limited to $I_{bias}$, which effectively reduces the "noise-to-ground" voltage and voltage undershoots. Thus, said resonator-current "I" does not depend from the resonator parameters or the impedance of FET M1 (item 200). It is always controlled for staying at a peak value of $I_{bias}$. Any possible distortion effects, resulting out of excess resonator-currents "I" on the generated sinus wave are effectively reduced.

Figure 3:
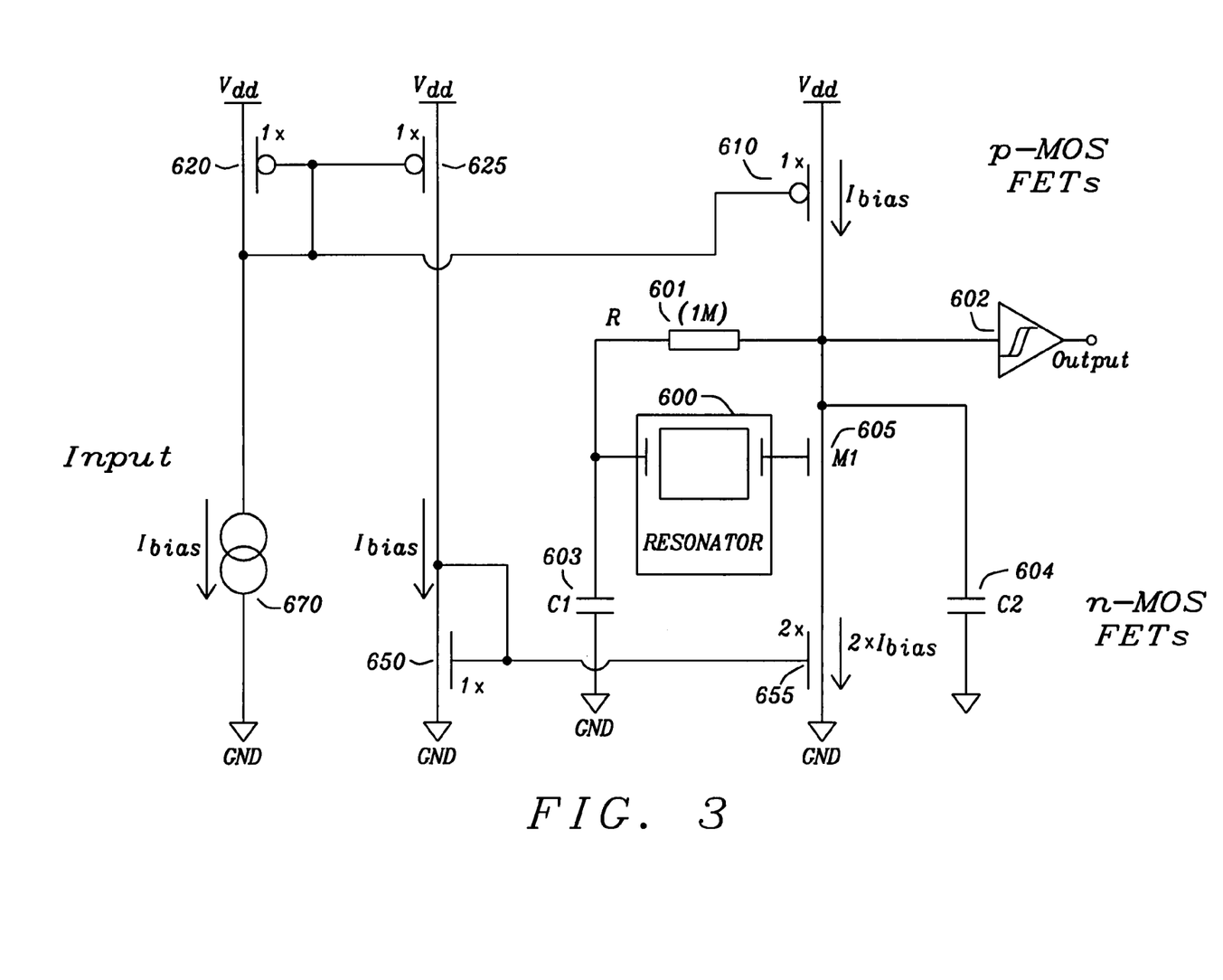
FIG. 3 depicts the additionally introduced, enhancing current source for the new oscillator circuit with said Smart Current Controlled (SCC) Resonator Driver components as shown in FIG. 2B.

Looking now at FIG. 3, which depicts the additionally introduced, enhancing current source as part of a current source control system for the new oscillator circuit with said SCC Resonator Driver as shown in FIG. 2B. This controlled current source system is implemented as a stacked two stage current mirror circuit, in order to allow for a floating insertion of the intrinsic three-point resonator circuit driver with FET M1 (605), between a first current source with $1*I_{bias}$ and a second controlled current source with $2*I_{bias}$, as necessitated for the SCC Resonator Driver oscillator circuit. Three identical p-MOS FETs (610, 620 & 625) for the first stage are connected to the supply voltage $V_{dd}$; the pair of FETs 620 with 625 forming a first current mirror and the pairing of FETs 620 with 610 forming a second current mirror. Two n-MOS FETs (650 & 655) are connected to ground (GND) establishing the second stage of said current mirrors, the pair of FETs 650 with 655 forming another current mirror, FET 650 has half the size 1 of FET 655, thus mirroring $1*I_{bias}$ as doubled into $2*I_{bias}$.

The stacked combination of p-MOS FET 625 with n-MOS FET 650 as voltage potential shifter, i.e. serially connected and both conducting the same current $1*I_{bias}$ connects the two stage levels pertaining to either supply voltage $V_{dd}$ or to ground voltage GND. The intrinsic three-point resonator circuit consisting of high impedance resistor R (601), the oscillator load capacitors C1 and C2 (603 and 604) with resonator two-pole (600) (see FIG. 2B) is now being appropriately tied in between p-MOS FET 610 (for $1*I_{bias}$) and n-MOS FET 655 (for $2*I_{bias}$), connecting its node 2 to p-MOS FET 610 ($1*I_{bias}$) and connecting its FET M1 (605, shown as item 200 in FIG. 2B) to n-MOS FET 655 ($2*I_{bias}$), thus completing the novel SCC Resonator Driver oscillator circuit. The p-MOS FET 620 is fed by the input current source with $I_{bias}$, single-side connected to ground (GND), mirroring said current $I_{bias}$ into said two mirror FETs, p-MOS FET 625 on the one hand and p-MOS FET 610 on the other hand. Putting on record: this solution for a current source control system allows a grounded current source to control two current sources on different voltage potentials i.e. voltage shifted against each other. The output signal of the oscillator is obtained via amplifier (602).

Figure 4A:
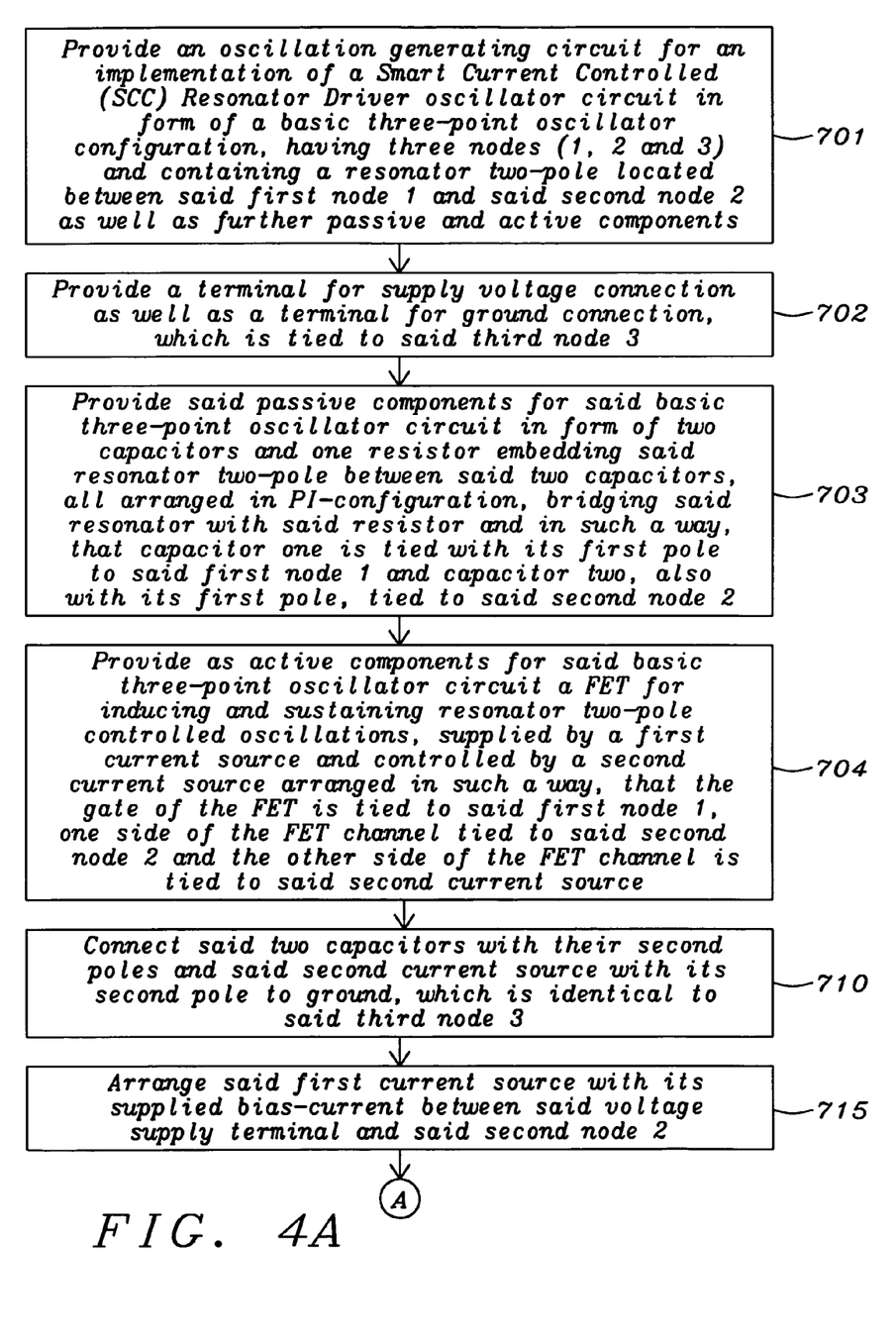
FIGS. 4A–4C describe with the help of a flow diagram the according method for constructing and operating said SCC Resonator Driver circuit as shown in FIG. 2B.
Figure 4B:
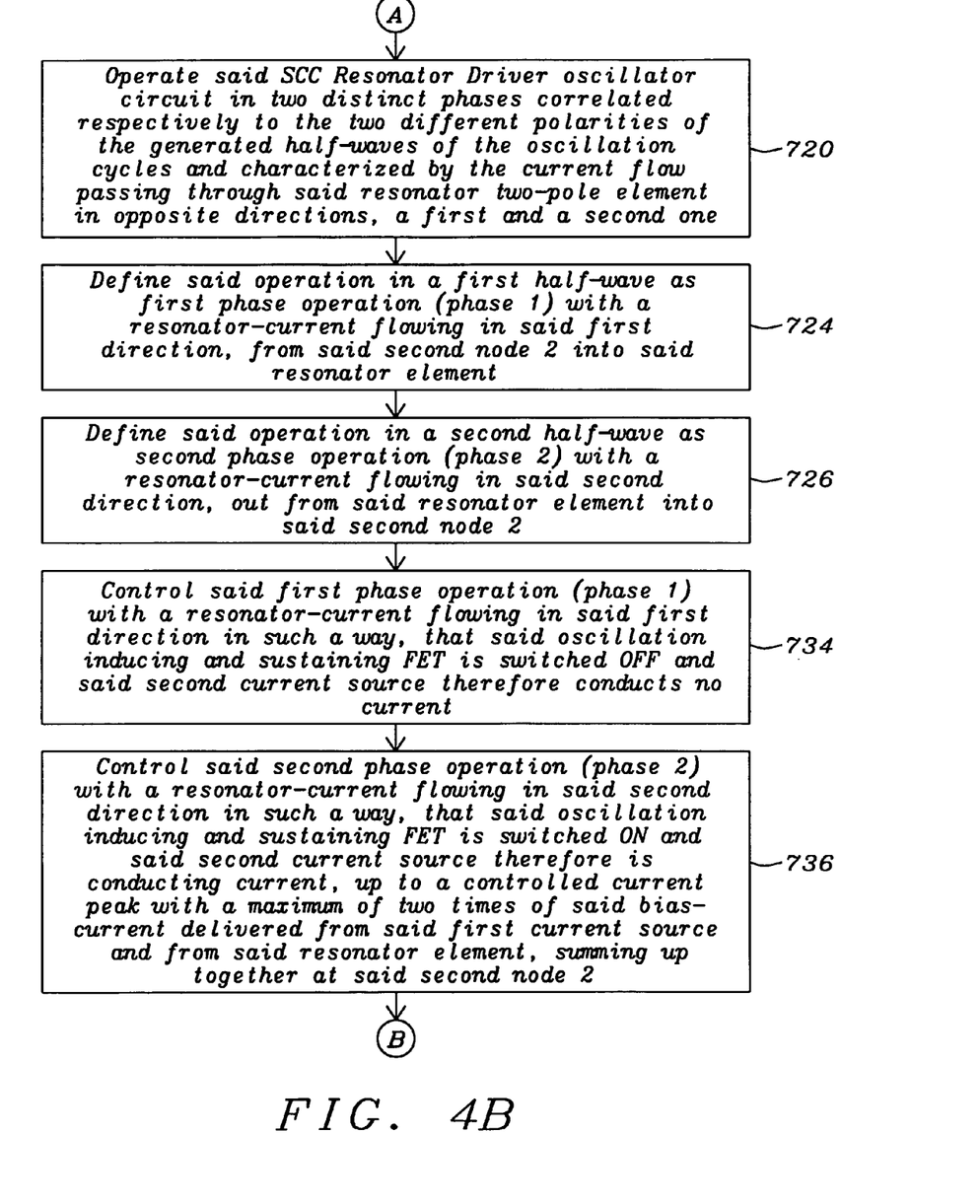
Figure 4C:
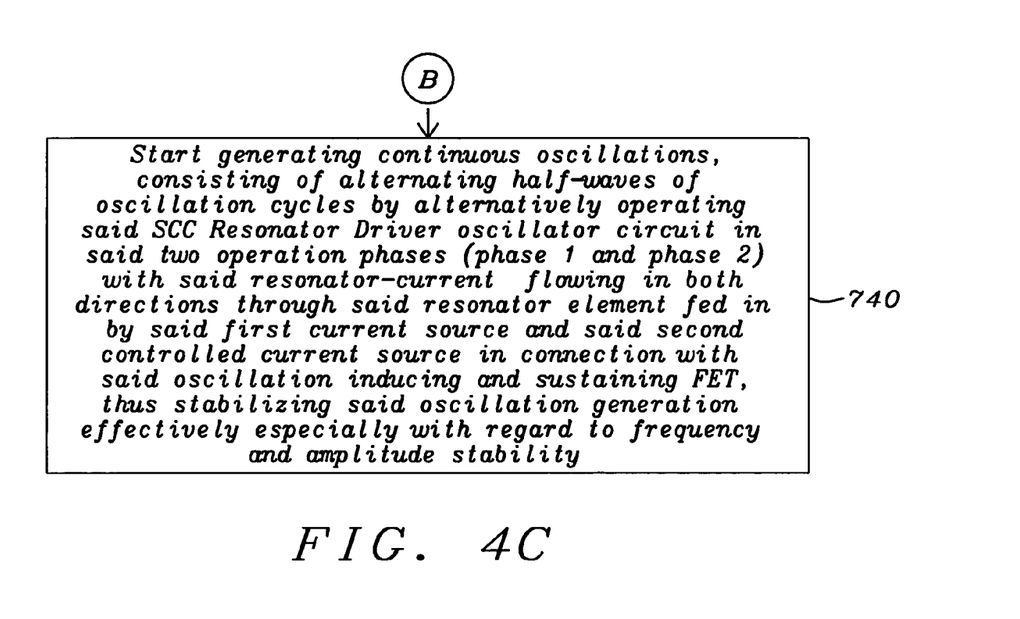

Regarding the flow diagram given in FIGS. 4A–4C, a method, explaining the construction and operation of the novel Smart Current Controlled (SCC) Resonator Driver oscillator circuit according to the invention and exemplified with the circuit diagram of FIG. 2B is now described and its steps defined, wherein the first step 701 provides an oscillation generating circuit for an implementation of an SCC Resonator Driver oscillator circuit in form of a basic three-point oscillator configuration, having three nodes (1, 2 and 3) and containing a resonator two-pole located between said first node 1 and said second node 2 as well as further passive and active components. Step 702 provides a terminal for supply voltage connection as well as a terminal for ground connection, which is tied to said third node 3, step 703 provides said passive components for said basic three-point oscillator circuit in form of two capacitors and one resistor embedding said resonator two-pole between said two capacitors, all arranged in PI-configuration, bridging said resonator with said resistor and in such a way, that capacitor one is tied with its first pole to said first node 1 and capacitor two, also with its first pole, tied to said second node 2, and step 704 provides as active components for said basic three-point oscillator circuit a FET for inducing and sustaining resonator two-pole controlled oscillations, supplied by a first current source and controlled by a second current source arranged in such a way, that the gate of the FET is tied to said first node 1, one side of the FET channel tied to said second node 2 and the other side of the FET channel is tied to said second current source. Step 710 then connects said two capacitors with their second poles and said second current source with its second pole to ground, which is identical to said third node 3 and step 715 arranges said first current source with its supplied bias-current between said voltage supply terminal and said second node 2. With step

720 said SCC Resonator Driver oscillator circuit is operated in two distinct phases correlated respectively to the two different polarities of the generated half-waves of the oscillation cycles and characterized by the current flow passing through said resonator two-pole element in opposite directions, a first and a second one. Steps 724 and 726 define said operation in a first half-wave as first phase operation (phase 1) with a resonator-current flowing in said first direction, from said second node 2 into said resonator element and also define said operation in a second half-wave as second phase operation (phase 2) with a resonator-current flowing in said second direction, out from said resonator element into said second node 2. Equally steps 734 and 736 control said first phase operation (phase 1) with a resonator-current flowing in said first direction in such a way, that said oscillation inducing and sustaining FET is switched OFF and said second current source therefore conducts no current and also control said second phase operation (phase 2) with a resonator-current flowing in said second direction in such a way, that said oscillation inducing and sustaining FET is switched ON and said second current source therefore is conducting current, up to a controlled current peak with a maximum of two times of said bias-current delivered from said first current source and from said resonator element, summing up together at said second node 2. Finally step 740 starts generating continuous oscillations, consisting of alternating half-waves of oscillation cycles by alternatively operating said SCC Resonator Driver oscillator circuit in said two operation phases (phase 1 and phase 2) with said resonator-current flowing in both directions through said resonator element fed in by said first current source and said second controlled current source in connection with said oscillation inducing and sustaining FET, thus stabilizing said oscillation generation effectively especially in regard to frequency and amplitude stability.

Figure 5A:
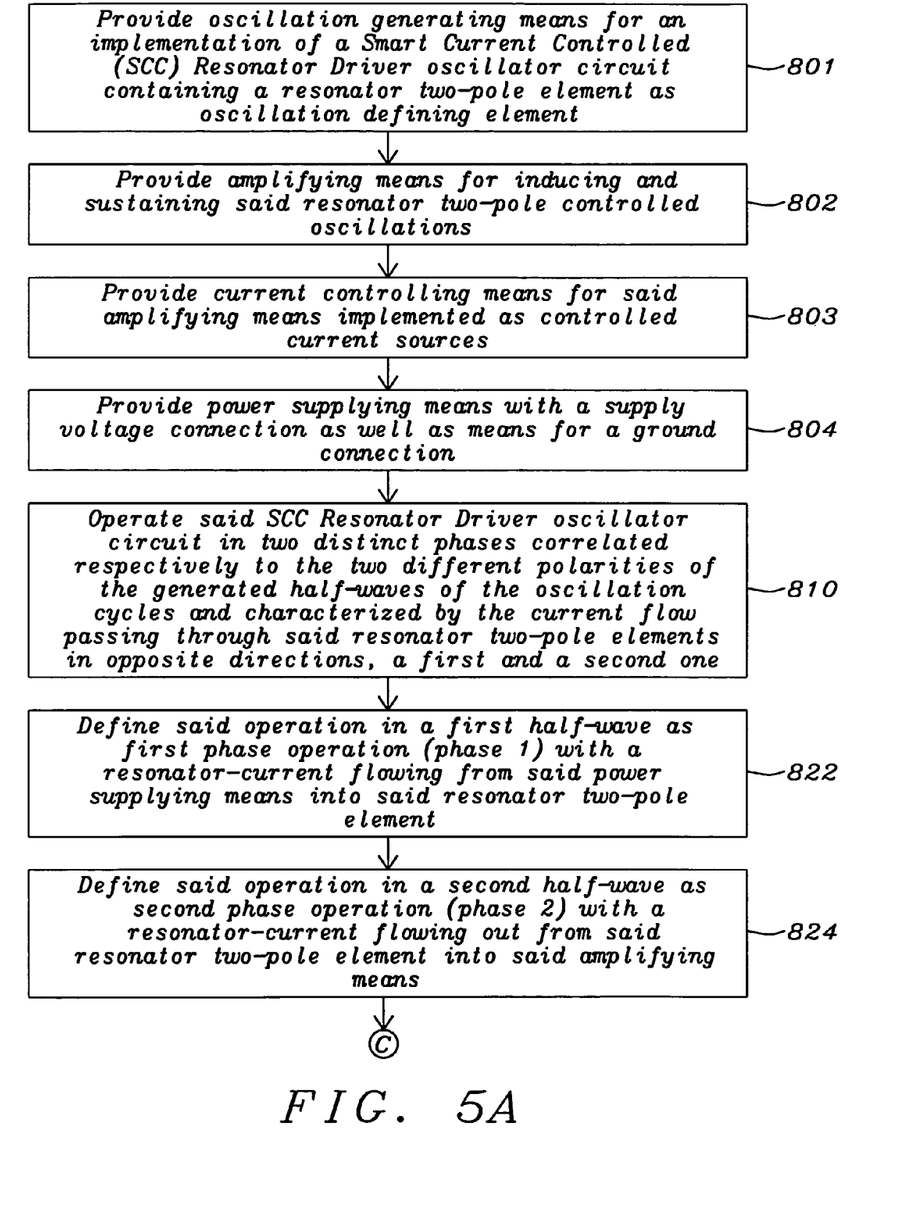
FIGS. 5A & 5B explain with the help of another flow diagram a more general method for constructing and operating an SCC Resonator Driver circuit.
Figure 5B:
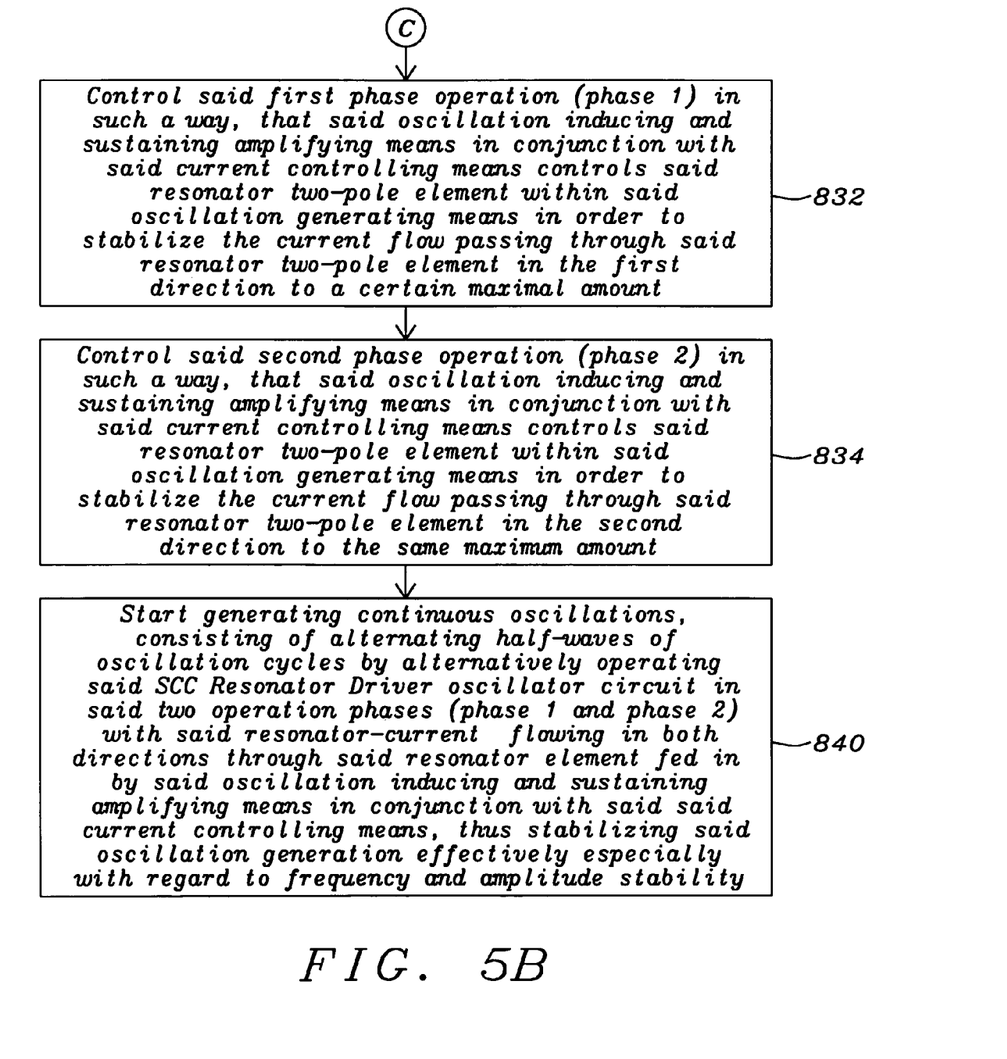

Regarding now the flow diagram given in FIGS. 5A & 5B, a much more general method, explaining the construction and operation of a novel Smart Current Controlled (SCC) Resonator Driver oscillator circuit according to the invention is now described and its steps defined, wherein as first step 801 oscillation generating means for an implementation of an SCC Resonator Driver oscillator circuit containing a resonator two-pole element as oscillation defining element is provided. Step 802 provides amplifying means for inducing and sustaining said resonator two-pole controlled oscillations, step 803 provides current controlling means for said amplifying means implemented as controlled current sources, step 804 provides power supplying means with a supply voltage connection as well as means for a ground connection. Within step 810 said SCC Resonator Driver oscillator circuit is operated in two distinct phases correlated respectively to the two different polarities of the generated half-waves of the oscillation cycles and characterized by the current flow passing through said resonator two-pole elements in opposite directions, a first and a second one. Steps 822 and 824 define said operation in a first half-wave as first phase operation (phase 1) with a resonator-current flowing from said power supplying means into said resonator two-pole element and define said operation in a second half-wave as second phase operation (phase 2) with a resonator-current flowing out from said resonator two-pole element into said amplifying means. Step 832 and 834 control said first phase operation (phase 1) in such a way, that said oscillation inducing and sustaining amplifying means in conjunction with said current controlling means controls said resonator two-pole element within said oscillation generating means in order to stabilize the current flow passing through said resonator two-pole element in the first direction to a certain maximal amount and also control said second phase operation (phase 2) in such a way, that said oscillation inducing and sustaining amplifying means in conjunction with said current controlling means controls said resonator two-pole element within said oscillation generating means in order to stabilize the current flow passing through said resonator two-pole element in the second direction to the same maximal amount. And finally step 840 starts generating continuous oscillations, consisting of alternating half-waves of oscillation cycles by alternatively operating said SCC Resonator Driver oscillator circuit in said two operation phases (phase 1 and phase 2) with said resonator-current flowing in both directions through said resonator element fed in by said oscillation inducing and sustaining amplifying means in conjunction with said current controlling means, thus stabilizing said oscillation generation effectively especially with regard to frequency and amplitude stability.

Summarizing the essential operational features of the circuit we find, that therewith a new method for a stable oscillation generating is realized, because the current peaks through a resonator element are limited to a prescribed biasing current value and by this means a substantial noise to ground reduction and equally a distortion reduction is achieved.

As shown in the preferred embodiments and evaluated by circuit analysis, the novel system, circuits and methods provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A circuit, realizing a new oscillator circuit with a Smart Current Controlled (SCC) Resonator Driver and accounting for differences in operation at positive and negative half-waves of oscillation cycles, comprising:
   an oscillation generating circuit in form of a basic three-point oscillator configuration, having three nodes (1, 2 and 3) and containing a resonator two-pole located between said first node 1 and said second node 2;
   a terminal pin for supply voltage connection;
   a terminal pin for ground connection, which is tied to said third node 3;
   two capacitors and one resistor as passive components, whereby said passive components are embedding said resonator two-pole between said two capacitors, all components arranged in PI-configuration, bridging said resonator with said resistor and arranged in such a way, that capacitor one is tied with its first pole to said first node 1 and capacitor two, also with its first pole, is tied to said second node 2;
   a Field Effect Transistor (FET) for inducing and sustaining resonator two-pole controlled oscillations as basic active component;
   a first current source as active supply component connected to said supply voltage and arranged in such a way, that said active supply component supplying a bias-current is located between said voltage supply terminal and said second node 2; and
   a second current source as active ground component connected to ground, whereby said FET as basic active component, supplied by said first current source as active supply component is controlled by said second current source as active ground component and whereby said three active components are arranged in such a way, that the gate of the FET is tied to said first node 1, one side of the FET channel tied to said second node 2 and the other side of the FET channel is tied to said second current source thus allowing for a resonator-current stabilization during said different operations at positive and negative half-waves of oscillation cycles, and thus effectively stabilizing said oscillation generation especially with regard to frequency and amplitude stability.

2. The circuit according to claim 1 wherein said resonator element is a crystal resonator element that produces an oscillating signal having a predetermined oscillation frequency.

3. The circuit according to claim 2 wherein said crystal resonator element is a Quartz crystal.

4. The circuit according to claim 2 wherein said crystal resonator element is a Piezo crystal.

5. The circuit according to claim 1 wherein said resonator element is a resonator element fabricated using Thin-Film Resonator (TFR) technologies.

6. The circuit according to claim 1 wherein said resonator element is a serial connection of an inductor, a capacitor and a resistor.

7. The circuit according to claim 1 wherein said resonator element is a parallel connection of an inductor, a capacitor and a resistor.

8. The circuit according to claim 1 wherein said resonator element is a resonator circuit fabricated using MEMS technologies.

9. The circuit according to claim 1 manufactured using modern integrated circuit technologies.

10. The circuit according to claim 9 manufactured as a monolithic integrated circuit.

11. The circuit according to claim 9 manufactured as integrated circuit in monolithic CMOS technology.

12. A circuit, realizing a new oscillator circuit with a Smart Current Controlled (SCC) Resonator Driver and accounting for differences in operation at positive and negative half-waves of oscillation cycles, comprising:
oscillation generating means containing a resonator two-pole element as oscillation defining element;
amplifying means for inducing and sustaining said resonator two-pole controlled oscillations;
power supplying means with supply voltage connection;
means for a ground connection; and
current controlling means for said amplifying means implemented as controlled current sources arranged in such a way, that said amplifying means is fed with appropriately controlled currents depending on its operation at positive and negative half-waves of an oscillation cycle always securing a resonator-current flowing through said resonator two-pole necessary for optimized driving of said resonator element and thus allowing for a resonator-current stabilization during said different operations at positive and negative half-waves of oscillation cycles, therefore effectively stabilizing said oscillation generation especially with regard to frequency and amplitude stability.

13. The circuit according to claim 12 wherein said oscillation generating means is implemented as a three-point oscillator circuit.

14. The circuit according to claim 12 wherein said oscillation generating means is implemented as a Pierce oscillator circuit.

15. The circuit according to claim 12 wherein said amplifying means is implemented as a Field Effect Transistor (FET).

16. The circuit according to claim 15 wherein said FET is of the n-MOS type.

17. The circuit according to claim 15 wherein said FET is of the p-MOS type.

18. The circuit according to claim 12 wherein said power supplying means is implemented as a current source.

19. The circuit according to claim 12 wherein said current controlling means is implemented as a controlled current source.

20. The circuit according to claim 12 wherein said means for a ground connection means is a ground terminal.

21. The circuit according to claim 12 wherein said resonator two-pole element is a crystal resonator element that produces an oscillating signal having a predetermined oscillation frequency.

22. The circuit according to claim 21 wherein said crystal resonator element is a Quartz crystal.

23. The circuit according to claim 21 wherein said crystal resonator element is a Piezo crystal.

24. The circuit according to claim 12 wherein said resonator two-pole element is a resonator element fabricated using Thin-Film Resonator (TFR) technologies.

25. The circuit according to claim 12 wherein said resonator two-pole element is a serial connection of an inductor, a capacitor and a resistor.

26. The circuit according to claim 12 wherein said resonator two-pole element is a parallel connection of an inductor, a capacitor and a resistor.

27. The circuit according to claim 12 wherein said resonator two-pole element is a resonator circuit fabricated using MEMS technologies.

28. The circuit according to claim 12 manufactured using modern integrated circuit technologies.

29. The circuit according to claim 28 manufactured as a monolithic integrated circuit.

30. The circuit according to claim 28 manufactured as integrated circuit in monolithic CMOS technology.

31. A method for an oscillation generating circuit implemented as a Smart Current Controlled (SCC) Resonator Driver oscillator circuit and accounting for differences in operation at positive and negative half-waves of oscillation cycles, comprising:
providing oscillation generating means containing a resonator two-pole element as oscillation defining element;
providing amplifying means for inducing and sustaining said resonator two-pole controlled oscillations;
providing current controlling means for said amplifying means implemented as controlled current sources;
providing power supplying means with supply voltage connection;
providing means for a ground connection;
operating said SCC Resonator Driver oscillator circuit in two distinct phases correlated respectively to the two different polarities of the generated half-waves of the oscillation cycles and characterized by the current flow passing through said resonator two-pole elements in opposite directions, a first and a second one related to positive or negative polarities;
defining said operation in a first half-wave as first phase operation (phase 1) with a resonator-current flowing from said power supplying means into said resonator two-pole element;

defining said operation in a second half-wave as second phase operation (phase 2) with a resonator-current flowing out from said resonator two-pole element into said amplifying means;

controlling said first phase operation (phase 1) in such a way, that said oscillation inducing and sustaining amplifying means in conjunction with said current controlling means controls said resonator two-pole element within said oscillation generating means in order to stabilize the current flow passing through said resonator two-pole element in the first direction to a certain maximal amount;

controlling said second phase operation (phase 2) in such a way, that said oscillation inducing and sustaining amplifying means in conjunction with said current controlling means controls said resonator two-pole element within said oscillation generating means in order to stabilize the current flow passing through said resonator two-pole element in the second direction to the same maximum amount; and starting the generation of continuous oscillations, consisting of alternating half-waves of oscillation cycles by alternatively operating said SCC Resonator Driver oscillator circuit in said two operation phases (phase 1 and phase 2) with said resonator-current flowing in both directions through said resonator element fed in by said oscillation inducing and sustaining amplifying means in conjunction with said current controlling means, thus stabilizing said oscillation generation effectively especially with regard to frequency and amplitude stability.

32. A method for an oscillation generating circuit implemented as a Smart Current Controlled (SCC) Resonator Driver oscillator circuit and accounting for differences in operation at positive and negative half-waves of oscillation cycles, comprising:

providing an oscillation generating circuit in form of a basic three-point oscillator configuration, having three nodes (1, 2 and 3) and containing a resonator two-pole located between said first node 1 and said second node 2 as well as further passive and active components;

providing a terminal for supply voltage connection;

providing a terminal for ground connection, which is tied to said third node 3;

providing said passive components for said basic three-point oscillator circuit in form of two capacitors and one resistor embedding said resonator two-pole between said two capacitors, all arranged in PI-configuration, bridging said resonator with said resistor and in such a way, that capacitor one is tied with its first pole to said first node 1 and capacitor two, also with its first pole, tied to said second node 2;

providing as active components for said basic three-point oscillator circuit a FET for inducing and sustaining resonator two-pole controlled oscillations, supplied by a first current source and controlled by a second current source arranged in such a way, that the gate of the FET is tied to said first node 1, one side of the FET channel tied to said second node 2 and the other side of the FET channel is tied to said second current source;

connecting said two capacitors with their second poles and said second current source with its second pole to ground, which is identical to said third node 3;

arranging said first current source with its supplied bias-current between said voltage supply terminal and said second node 2;

operating said SCC Resonator Driver oscillator circuit in two distinct phases correlated respectively to the two different polarities—positive or negative—of the generated half-waves of the oscillation cycles and characterized by the current flow passing through said resonator two-pole element in opposite directions, a first and a second one;

defining said operation in a first half-wave as first phase operation (phase 1) with a resonator-current flowing in said first direction, from said second node 2 into said resonator element;

defining said operation in a second half-wave as second phase operation (phase 2) with a resonator-current flowing in said second direction, out from said resonator element into said second node 2;

controlling said first phase operation (phase 1) with a resonator-current flowing in said first direction in such a way, that said oscillation inducing and sustaining FET is switched OFF and said second current source therefore conducts no current;

controlling said second phase operation (phase 2) with a resonator-current flowing in said second direction in such a way, that said oscillation inducing and sustaining FET is switched ON and said second current source therefore is conducting current, up to a controlled current peak with a maximum of two times of said bias-current delivered from said first current source and from said resonator element, summing up together at said second node 2; and starting the generation of continuous oscillations, consisting of alternating half-waves of oscillation cycles by alternatively operating said SCC Resonator Driver oscillator circuit in said two operation phases (phase 1 and phase 2) with said resonator-current flowing in both directions through said resonator element fed in by said first current source and said second controlled current source in connection with said oscillation inducing and sustaining FET, thus stabilizing said oscillation generation effectively especially in regard to frequency and amplitude stability.

* * * * *